(12) United States Patent
Choi

(10) Patent No.: US 9,059,150 B2
(45) Date of Patent: Jun. 16, 2015

(54) CONDUCTIVE BUMP, SEMICONDUCTOR CHIP AND STACKED SEMICONDUCTOR PACKAGE USING THE SAME

(71) Applicant: SK hynix Inc., Icheon-si Gyeonggi-do (KR)

(72) Inventor: Hyeong Seok Choi, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/723,992

(22) Filed: Dec. 21, 2012

(65) Prior Publication Data
US 2014/0048930 A1    Feb. 20, 2014

(30) Foreign Application Priority Data
Aug. 16, 2012 (KR) .......... 10-2012-0089658

(51) Int. Cl.
| | | |
|---|---|---|
| H01L 23/48 | (2006.01) | |
| H01L 23/482 | (2006.01) | |
| H01L 25/04 | (2014.01) | |
| H01L 23/00 | (2006.01) | |
| H01L 25/065 | (2006.01) | |
| H01L 23/31 | (2006.01) | |
| H01L 25/03 | (2006.01) | |

(52) U.S. Cl.
CPC .............. *H01L 23/482* (2013.01); *H01L 25/04* (2013.01); *H01L 24/13* (2013.01); *H01L 2224/16145* (2013.01); *H01L 2224/73204* (2013.01); *H01L 23/3128* (2013.01); *H01L 25/03* (2013.01); *H01L 25/0657* (2013.01); *H01L 2225/06513* (2013.01); *H01L 2225/06541* (2013.01)

(58) Field of Classification Search
CPC ................... H01L 24/12; H01L 24/13; H01L 2224/13017; H01L 2224/13019; H01L 23/482; H01L 25/043
USPC ........................................ 257/738, 737, 739
See application file for complete search history.

(56) References Cited

U.S. PATENT DOCUMENTS

| | | | | |
|---|---|---|---|---|
| 6,710,446 | B2 * | 3/2004 | Nagai et al. .................... | 257/737 |
| 7,683,473 | B2 * | 3/2010 | Kasai et al. .................... | 257/698 |
| 7,863,747 | B2 * | 1/2011 | Lee ................ | 257/758 |
| 2002/0130412 | A1 * | 9/2002 | Nagai et al. .................... | 257/737 |
| 2007/0105304 | A1 * | 5/2007 | Kasai et al. .................... | 438/254 |
| 2009/0160051 | A1 * | 6/2009 | Lee ................ | 257/737 |
| 2010/0044847 | A1 * | 2/2010 | Lee ................ | 257/686 |
| 2010/0059897 | A1 * | 3/2010 | Fay et al. ...................... | 257/777 |

FOREIGN PATENT DOCUMENTS

| | | | |
|---|---|---|---|
| KR | 1020090011198 A | 2/2009 | |
| KR | 1020100121857 A | 11/2010 | |

\* cited by examiner

*Primary Examiner* — Tu-Tu Ho
(74) *Attorney, Agent, or Firm* — William Park & Associates Ltd.

(57) ABSTRACT

A conductive bump includes a step member formed to form a step on a portion of a connection pad; and a conductive member formed on the connection pad and the step member and having an inclined surface which is inclined with respect to the connection pad.

7 Claims, 11 Drawing Sheets

CONDUCTIVE BUMP, SEMICONDUCTOR
CHIP AND STACKED SEMICONDUCTOR
PACKAGE USING THE SAME

CROSS-REFERENCE TO RELATED
APPLICATIONS

The present application claims priority to Korean Patent Application Number 10-2012-0089658 filed in the Korean Intellectual Property Office on Aug. 16, 2012, which is incorporated herein by reference in its entirety.

BACKGROUND

1. Field of Invention

The present invention generally relates to a semiconductor package, and more particularly, to a conductive bump formed for connection to an outside, a semiconductor chip and a stacked semiconductor package using the same.

2. Description of the Related Art

In the semiconductor industry, packaging technologies for semiconductor integrated circuits have continuously been developed to meet the demands toward miniaturization and mounting efficiency. Recently, as the miniaturization and high performance of electric and electronic appliances are demanded, various stacking techniques have been developed.

The term "stack" that is referred to in the semiconductor industry means to vertically pile at least two semiconductor chips or semiconductor packages. In the case of a memory device, by using a stacking technology, it is possible to realize a product having memory capacity at least two times greater than that obtainable through semiconductor integration processes, and mounting area utilization efficiency can be elevated.

In a conventional stacked semiconductor package, since signal transmission between stacked semiconductor chips is implemented by wires, a problem is caused in that an operation speed decreases. Also, since an additional area for wire bonding is needed in a substrate, the size of the stacked semiconductor package increases. Further, since a gap is needed to bond wires to the bonding pads of the respective semiconductor chips, the overall height of the stacked semiconductor package increases.

Thus, recently, in order to overcome the disadvantages of the conventional stacked semiconductor package, the structure of a stacked semiconductor package using through vias has been is suggested.

Referring to FIGS. 1 and 2, in a conventional stacked semiconductor package 10 using through vias, after defining via holes (not shown) in respective semiconductor chips 12, through vias 13 are formed by filling a metal layer in the via holes through a plating process, and the semiconductor chips 12 formed with the through vias 13 are stacked such that electrical connection between the semiconductor chips 12 is implemented through the through vias 13.

Therefore, in the stacked semiconductor package using the through vias 13, an additional area for wire bonding is not needed in a substrate 11, a gap is not needed to perform wire bonding between the semiconductor chips 12, and a signal transmission length to the respective semiconductor chips 12 is shortened. As a consequence, advantages are provided in that the overall size and height of the stacked semiconductor package may be decreased when compared to the conventional stacked semiconductor package, and the operation speed of the stacked semiconductor package may be improved.

Bumps 14 and 15 may be formed on the through vias 13 to serve as external connection terminals. In general, such bumps 14 and 15 are formed by forming a barrier metal on one surface or both surfaces of each of the semiconductor chips 12 to a predetermined thickness, aligning a mask and then performing etching.

After forming upper bumps 14 and lower bumps 15 of predetermined heights on the through vias 13 of the respective semiconductor chips 12 through such a process, semiconductor chips are stacked on the substrate 11. Then, solder balls 16 are attached to the lower surface of the substrate 11, and the plurality of stacked semiconductor chips 12 are encapsulated by an encapsulation member 17 such as epoxy resin, by which the stacked semiconductor package is manufactured. The numeral 15a indicates a connection member such as a solder.

When manufacturing the stacked semiconductor package using the through vias 13, underfill members 18 such as NCPs (non-conductive pastes) or NCFs (non-conductive films) are used to fill gaps between upper semiconductor chips and lower semiconductor chips. However, as shown in FIG. 2, in the conventional stacked semiconductor package, fillers 18a contained in the underfill members 18 which are added to increase a mechanical strength are likely to be trapped between the upper bumps 14 and the lower bumps 15, by which a connection fail may occur between the semiconductor chips 12 and the junction strength of the bumps 14 and 15 may be degraded.

That is to say, although it is advantageous in improving the connectivity of the stacked semiconductor chips 12 for the fillers 18a to be smoothly released out of the bumps 14 and 15 when is bonding an upper semiconductor chip and a lower semiconductor chip, since the bumps 14 and 15 are formed to have substantially flat upper surfaces, the lateral mobility of the fillers 18a may deteriorate, as a result of which a connection fail may occur between the semiconductor chips 12 and the junction strength of the bumps may be degraded.

SUMMARY

Various embodiments are directed to a conductive bump which can improve the flowability of an underfill member interposed between semiconductor chips when stacking the semiconductor chips, thereby being capable of improving connectivity and adhesion properties between bumps of stacked semiconductor chips, a semiconductor chip and a stacked semiconductor package using the same.

In an embodiment, a conductive bump includes: a step member formed to form a step on a portion of a connection pad; and a conductive member formed on the connection pad and the step member and having an inclined surface which is inclined with respect to the connection pad.

The step member may substantially have the shape of any one of a hemisphere, a circular column, and a polygonal column.

The step member may be formed of an insulation substance or the same conductive substance as the connection pad.

The conductive bump may further include an insulation is member interposed between the connection pad and the step member formed of the conductive substance.

The inclined surface of the conductive member may be formed in a direction facing away from a position where the step member is formed.

The inclined surface of the conductive member may include a curved surface.

In an embodiment, a semiconductor chip includes: a semiconductor substrate having a first surface and a second surface which faces away from the first surface; a through via formed to pass through the first surface and the second surface of the semiconductor substrate; and an upper bump having a step member to form a step on a portion of the through via, and a conductive member formed on the through via and the step member to have an inclined surface which is inclined with respect to the through via.

The step member may be formed on the through via and a portion of the first surface of the semiconductor substrate.

The step member may substantially have the shape of any one of a hemisphere, a circular column, and a polygonal column.

The step member may be formed of an insulation substance or the same conductive substance as the through via.

The semiconductor chip may further include an insulation member interposed between the step member formed of the is conductive substance and the first surface of the semiconductor substrate.

The inclined surface of the conductive member may be formed in a direction facing away from a position where the step member is formed.

The inclined surface of the conductive member may include a curved surface.

The semiconductor chip may further include a lower bump formed on the second surface of the semiconductor substrate and electrically connected with the through via.

In an embodiment, a stacked semiconductor package includes: a plurality of semiconductor chips each including a semiconductor substrate having a first surface and a second surface which faces away from the first surface, a through via formed to pass through the first surface and the second surface of the semiconductor substrate, an upper bump having a step member to form a step on a portion of the through via disposed on the first surface of the semiconductor substrate and a conductive member formed on the through via and the step member to have an inclined surface which is inclined with respect to the through via, and a lower bump formed on the second surface of the semiconductor substrate and electrically connected with the through via, wherein the plurality of semiconductor chips are stacked such that the upper bump of a lower semiconductor chip which is disposed at the lower is among any two stacked semiconductor chips connects with the lower bump of an upper semiconductor chip which is disposed at the upper among any two stacked semiconductor chips.

The lower bump may include a connection member.

The step member may be formed of an insulation substance or the same conductive substance as the through via.

Each semiconductor chip may further include an insulation member interposed between the step member formed of the conductive substance and the first surface of the semiconductor substrate.

The stacked semiconductor package may further include underfill members filled between the stacked semiconductor chips.

The stacked semiconductor package may further include a base member disposed to face the second surface of the semiconductor substrate of the semiconductor chip which is positioned lowermost among the stacked semiconductor chips.

The base member may include any one of an interposer, a memory semiconductor chip, a non-memory semiconductor chip, a semiconductor package and a printed circuit board.

The stacked semiconductor package may further include an encapsulation member formed on the base member to encapsulate the stacked semiconductor chips.

DETAILED DESCRIPTION

Figure 1:
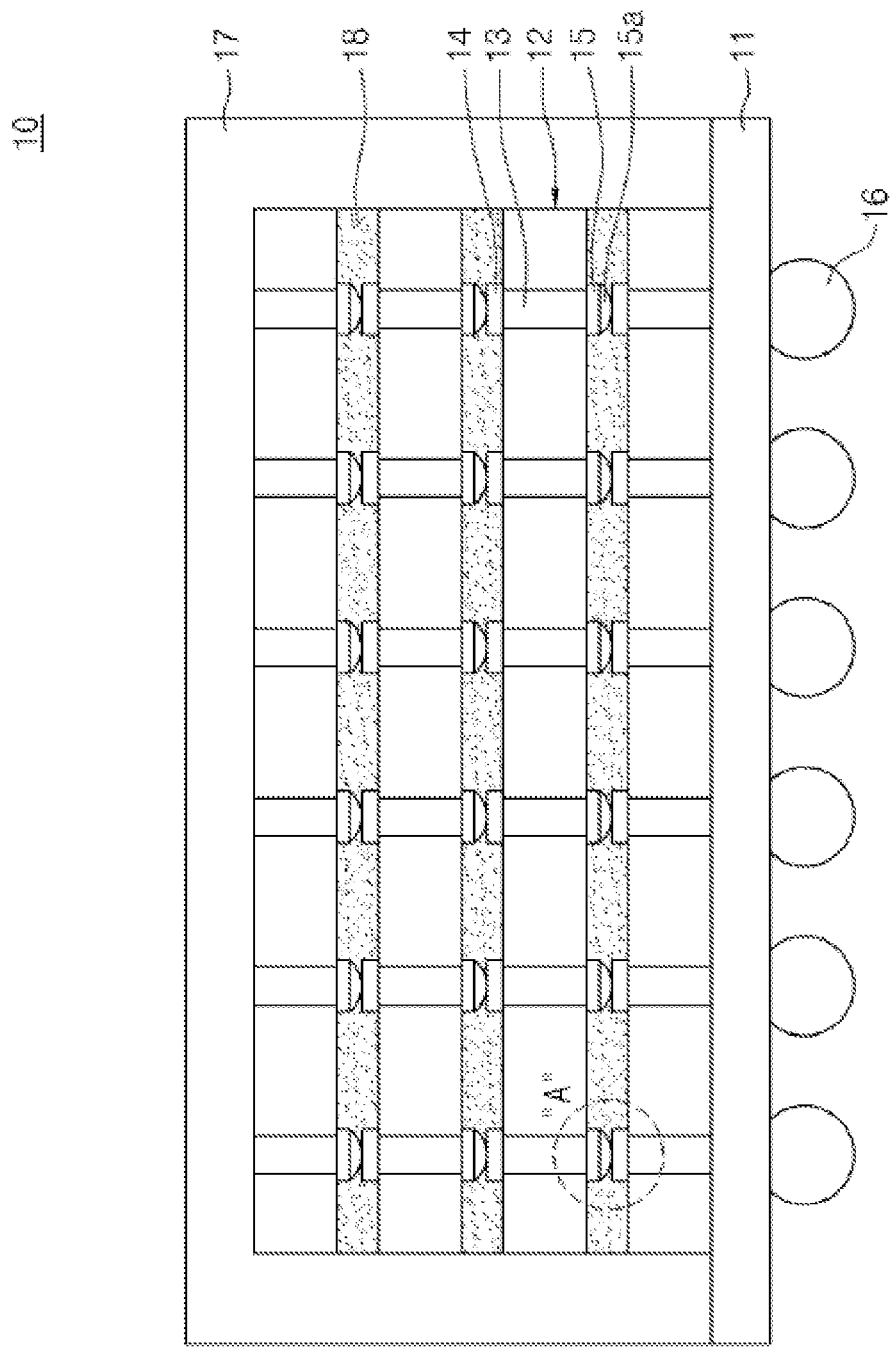
FIG. 1 is a cross-sectional view illustrating a conventional is stacked semiconductor package.
Figure 2:
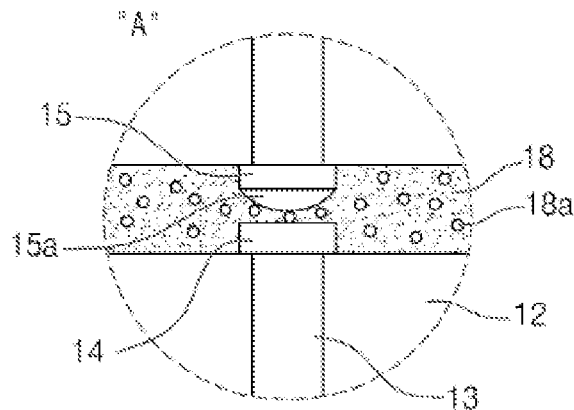
FIG. 2 is an enlarged view for the part "A" of FIG. 1.

Hereafter, various embodiments will be described in detail with reference to the accompanying drawings.

It is to be understood herein that the drawings are not is necessarily to scale and in some instances proportions may have been exaggerated in order to more clearly depict certain features of the invention. Also, the same reference numerals or the same reference designators may denote the same elements throughout the specification.

Figure 3:
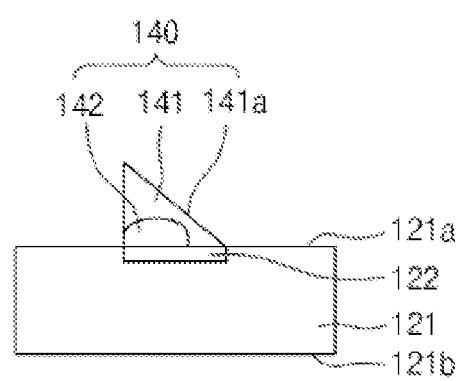
FIGS. 3 to 7 are cross-sectional views illustrating semiconductor chips in accordance with an embodiment.

FIG. 3 is a cross-sectional view illustrating a flip chip type semiconductor chip and a bump applied thereto in accordance with an embodiment. Referring to FIG. 3, a semiconductor chip 120 in accordance with an embodiment may include a semiconductor substrate 121 having a connection electrode, and a bump 140.

The semiconductor substrate 121 has a first surface 121a and a second surface 121b which faces away from the first surface 121a. As the connection electrode, for example, a connection pad 122 which is formed on the first surface 121a of the semiconductor substrate 121 may be adopted.

Figure 4:
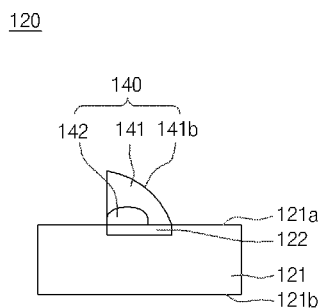

The bump 140 may include a step member 142 which may be formed on the semiconductor substrate 121 to cover a portion of the connection pad 122, and a conductive member 141 which may be formed on the step member 142 and the exposed portion of the connection pad 122. The conductive member 141 may have a substantially linear inclined surface 141a or a curved surface 141b with a predetermined radius of curvature as shown in FIG. 4, on a surface which faces the position where the step member 142 is formed.

The step member 142 may be formed on the first surface 121a of the semiconductor substrate 121 to cover the portion of the connection pad 122, and the conductive member 141 may be formed on the step member 142 and the exposed portion of the connection pad 122 on the first surface 121a of the semiconductor substrate 121.

Figure 7:
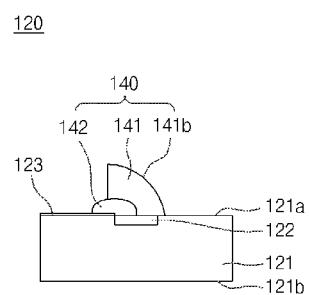

In an embodiment, the step member 142 may be formed of an insulation substance. Otherwise, the step member 142 may be formed of the same conductive substance as the connection pad 122 as shown in FIG. 7. In the case where the step member 142 is formed of the conductive substance, an insulation member 123 is interposed between the first surface 121a of the semiconductor substrate 121 and the step member 142.

Figure 5:
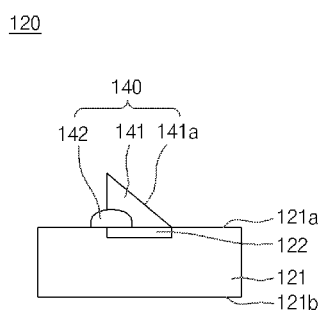
Figure 6:
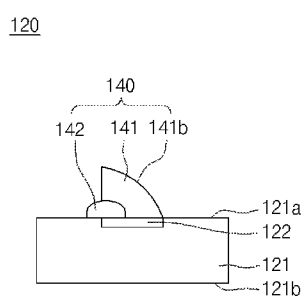

While the step member 142 may be formed to have a substantially hemispherical shape in an embodiment, it is to be noted that the step member 142 may be formed to substantially have a circular column shape or a polygonal column shape. Also, the step member 142 may be formed by changing its position. In other words, the step member 142 may be formed to cover a portion of the first surface 121a of the semiconductor substrate 121 and a portion of the connection pad 122 as shown in FIGS. 5 and 6. In this case, the conductive member 141 may be formed on a portion of the step member 142 and an exposed portion of the connection pad 122. The conductive member 141 may have a is substantially linear inclined surface 141a as shown in FIG. 5 or a curved surface 141b with a predetermined radius of curvature as shown in FIG. 6, on a surface which faces the position where the step member 142 is formed.

Figure 8:
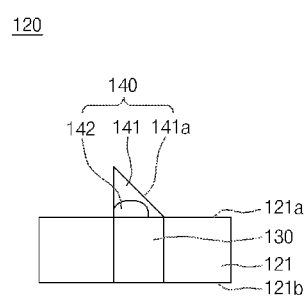
FIGS. 8 to 12 are cross-sectional views illustrating semiconductor chips in accordance with an embodiment.

FIG. 8 is a cross-sectional view illustrating a semiconductor chip with a through via and a bump applied thereto in accordance with an embodiment. Referring to FIG. 8, a semiconductor chip 120 in accordance with an embodiment may include a semiconductor substrate 121 having a connection electrode, and a bump 140.

The semiconductor substrate 121 has a first surface 121a and a second surface 121b which faces away from the first surface 121a. As the connection electrode, for example, a through via 130 which passes through the first surface 121a and the second surface 121b of the semiconductor substrate 121 may be adopted. The through via 130 is filled in a via hole and serves as an internal connection terminal. As the through via 130, a conductive substance, for example, copper may be adopted.

Figure 9:
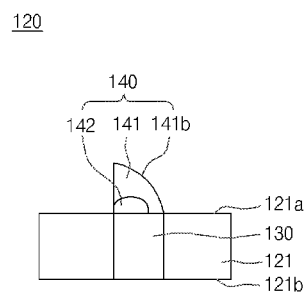

The bump 140 may include a step member 142 which may be formed on the semiconductor substrate 121 to cover a portion of the through via 130, and a conductive member 141 which may be formed on the step member 142 and the exposed portion of the through via 130. The conductive member 141 may have a substantially linear inclined surface 141a or a curved surface 141b is with a predetermined radius of curvature as shown in FIG. 9, on a surface which faces the position where the step member 142 is formed.

The step member 142 may be formed on the first surface 121a of the semiconductor substrate 121 to cover the portion of the through via 130, and the conductive member 141 may be formed on the step member 142 and the exposed portion of the through via 130 on the first surface 121a of the semiconductor substrate 121.

Figure 12:
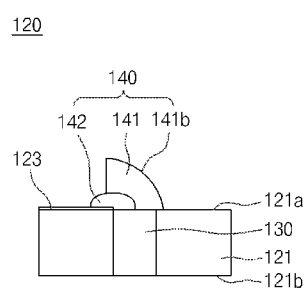

In an embodiment, the step member 142 may be formed of an insulation substance. Otherwise, the step member 142 may be formed of the same conductive substance as the through via 130 as shown in FIG. 12. In the case where the step member 142 is formed of the conductive substance, an insulation member 123 is interposed between the first surface 121a of the semiconductor substrate 121 and the step member 142.

Figure 10:
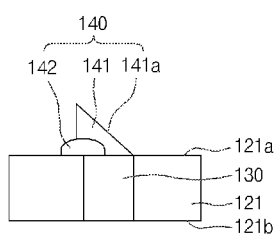
Figure 11:
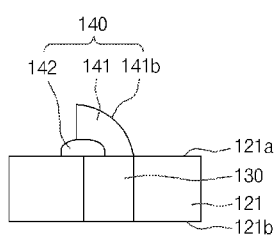

While the step member 142 may be formed in an embodiment to have a substantially hemispherical shape, it is to be noted that the step member 142 may be formed to have a circular column shape or a polygonal column shape. Also, the step member 142 may be formed by changing its position. In other words, the step member 142 may be formed to cover a portion of the first surface 121a of the semiconductor substrate 121 and a portion of the through via 130 as shown in FIGS. 10 and 11. In this case, the conductive member 141 may be formed on a portion of the step member 142 and an exposed portion of the through via 130. The conductive member 141 may have a substantially linear inclined surface 141a as shown in FIG. 10 or a curved surface 141b with a predetermined radius of curvature as shown in FIG. 11, on a surface which faces the position where the step member 142 is formed.

Figure 13A:
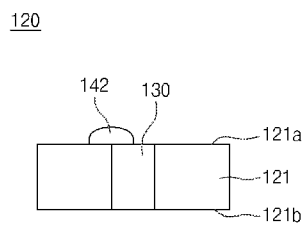
FIGS. 13A to 13C are cross-sectional views sequentially illustrating a manufacturing procedure of the semiconductor chip shown in FIG. 11.
Figure 13B:
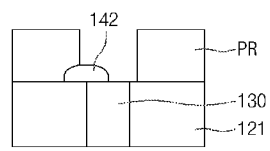
Figure 13C:
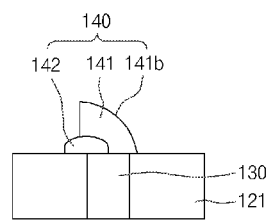

FIGS. 13A to 13C schematically illustrate a manufacturing procedure of the semiconductor chip with the conductive bump according to an embodiment. As the semiconductor chip formed with the bump, the semiconductor chip 120 shown in FIG. 11 is adopted.

Referring to FIG. 13A, after preparing a semiconductor substrate 121, a via hole with a predetermined diameter is defined to pass through a first surface 121a and a second surface 121b of the semiconductor substrate 121. The via hole may be defined through a well-known method, for example, a laser drilling process or a dry etching process. By filling a conductive substance in the via hole defined in this way, a through via 130 may be formed. As a conductive metal used as the through via 130, for example, copper may be employed.

A step member 142 may be formed on the first surface 121a of the semiconductor substrate 121 and the upper surface of the through via 130. The step member 142 may be formed to expose a portion of the upper surface of the through via 130. This is to allow a bump 140 formed on the step member 142 and the through via 130 to be electrically connected with the through via 130 (as shown in FIG. 13C). In an embodiment, the step member 142 may be formed to substantially cover one half of the through via 130 and expose the other half of the through via 130.

Referring to FIG. 13B, a photoresist PR may be coated on the first surface 121a (see FIG. 13A) of the semiconductor substrate 121 formed with the step member 142. Then, after aligning a mask with a position on the photoresist PR where the through via 130 is formed, by exposing and developing the mask-aligned photoresist PR, a portion of the step member 142, the portion of the through via 130 not covered by the step member 142, and an adjacent portion of the first surface 121a (see FIG. 13A) of the semiconductor substrate 121 are exposed.

Referring to FIG. 13C, by plating a conductive substance on the exposed portions, a conductive member 141 is formed. Since the step member 142 may be formed on the first surface 121a (see FIG. 13A) of the semiconductor substrate 121, the conductive member 141 may be formed such that its upper surface is inclined (i.e., linearly inclined as in FIG. 10, 141a) or curved 141b. Thereafter, by stripping the photoresist PR remaining on the first surface 121a (see FIG. 13A) of the semiconductor substrate 121, the manufacturing procedure of the semiconductor chip is completed.

Figure 14:
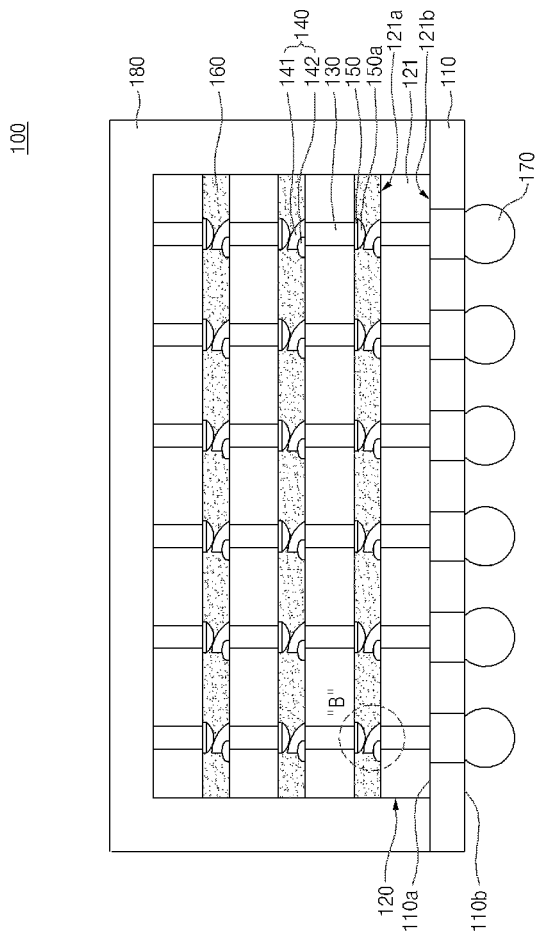
FIG. 14 is a cross-sectional view illustrating a stacked semiconductor package in accordance with an embodiment.
Figure 15:
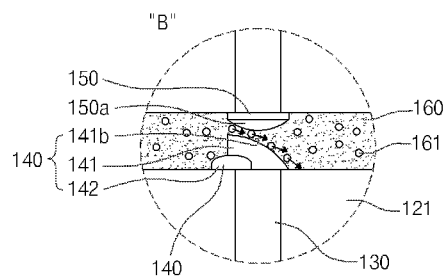
FIG. 15 is an enlarged view for the part "B" of FIG. 14.

FIGS. 14 and 15 are cross-sectional views illustrating a stacked semiconductor package in accordance with an embodiment. Referring to FIGS. 14 and 15, a stacked semiconductor package 100 in accordance with an embodiment may include a base member 110, a plurality of semiconductor chips 120, through vias 130, upper bumps 140, underfill members 160, and an encapsulation member 180.

The base member 110 has a first surface 110a and a second surface 110b which faces away from the first surface 110a. External connection terminals 170 such as solder balls are formed on the second surface 110b. As the base member 110, any one of an interposer, a memory semiconductor chip, a non-memory semiconductor chip, a semiconductor package and a printed circuit board may be adopted.

One or more semiconductor chips 120 may be vertically stacked on the first surface 110a of the base member 110. Each of the semiconductor chips 120 may include a circuit block for storing or processing data. Each semiconductor chip 120 has a first surface 121a and a second surface 121b which faces away from the first surface 121a. Further, in an embodiment, each semiconductor chip 120 may have one or more via holes which pass from the first surface 121a to the second surface 121b.

The through vias 130 are filled in the via holes and serve as internal connection terminals. As the through vias 130, a is conductive substance, for example, copper may be adopted.

Each upper bump 140 may include a step member 142 and a conductive member 141. Additionally, the upper bump 140 may include the step member 142 which may be formed on the semiconductor chip 120 to cover a portion of the through via 130, and the conductive member 141 which may be formed on a portion of the step member 142 and the exposed portion of the through via 130.

The step member 142 may be formed on the first surface 121a of the semiconductor chip 120 to cover the portion of the through via 130, and the conductive member 141 may be formed on the step member 142 and the exposed portion of the through via 130 on the first surface 121a of the semiconductor chip 120.

In an embodiment, the step member 142 may be formed of an insulation substance, for example, epoxy resin, not to be electrically connected with the through vias 130 or the conductive member 141. Further, the step member 142 may be formed of the same conductive substance as the through vias 130 as shown in FIG. 12. In the case where the step member 142 is formed of the conductive substance, an insulation member 123 (see FIG. 12) is interposed between the first surface 121a of the semiconductor substrate 121 and the step member 142.

While the step member 142 may be formed in an embodiment to have a substantially hemispherical shape, it is to be is noted that the step member 142 may be formed to have a circular column shape or a polygonal column shape. Also, the step member 142 may be formed by changing its position. In other words, the step member 142 may be formed to cover a portion of the first surface 121a of the semiconductor chip 120 and a portion of the through via 130 as shown in FIGS. 10 and 11. In this case, the conductive member 141 may be formed on a portion of the step member 142 and an exposed portion of the through via 130. The conductive member 141 may have a substantially linear inclined surface 141a as shown in FIG. 10 or a curved surface 141b with a predetermined radius of curvature as shown in FIG. 11, on a surface which faces the position where the step member 142 is formed.

The conductive member 141 may be formed on the step member 142 and the through via 130 through a plating process using the through via 130 as a seed. Namely, the conductive member may be formed by performing the steps of forming a seed metal on the first surface of the semiconductor chip including the step member and the exposed portion of the through via, forming a mask pattern to expose a portion of the seed metal which corresponds to the step member and the exposed portion of the through via, forming the conductive member on the exposed portion of the seed metal to have an inclined surface, and stripping the mask pattern and the underlying portion of the seed metal.

The conductive member 141 may be formed on the step member 142 and the through via 130 to be electrically connected with the portion of the through via 130 which is exposed out of the step member 142. In this way, since the conductive member 141 is plated in the state in which a step may be formed by the step member 142, the conductive member 141 may be naturally formed to have not a horizontal surface but an inclined surface 141b. That is to say, the conductive member 141 has the inclined surface 141b on a surface which faces the position where the step member 142 is formed. The inclined surface may include the curved surface 141b with a predetermined radius of curvature as shown in FIG. 9.

As the underfill members 160, for example, NCPs may be used. The underfill members 160 may contain fillers 161 for improving the adhesion strength between the stacked semiconductor chips 120.

Additionally, the stacked semiconductor package in accordance with an embodiment further may include lower bumps 150 which are formed on the second surface 121b of the semiconductor chip 120 and are electrically connected with the through vias 130.

In succession, effects accomplished by the stacked semiconductor package in accordance with an embodiment will be described with reference to FIGS. 14 and 15.

As shown in the drawings, an upper semiconductor chip 120 is stacked on a lower semiconductor chip 120 in a face-down type. In the respective semiconductor chips 120, the upper bumps 140 and the lower bumps 150 are formed at corresponding positions to be connected with each other. That is, a plurality of semiconductor chips 120 are stacked such that the upper bump of a lower semiconductor chip which is disposed at the lower among any two stacked semiconductor chips connects with the lower bump of an upper semiconductor chip which is disposed at the upper among any two stacked semiconductor chips. The upper bumps 140 and the lower bumps 150 may include copper. The lower bumps 150 may further include connection members 150a, such as solders, to be connected with the upper bumps 140 through a reflow process.

Additionally, as the upper bumps 140 of the respective semiconductor chips 120 are formed such that the surfaces facing the positions where the step members 142 are formed are inclined, contact areas between the upper bumps 140 and the lower bumps 150 of the semiconductor chips 120 stacked over them may be minimized.

Accordingly, when thereafter placing the underfill members 160 between the stacked semiconductor chips 120, the flowability of the underfill members 160 is improved due to the presence of the upper bumps 140 of the underlying semiconductor chip 120 which are formed with the inclined surfaces 141b. Due to this fact, the number of fillers 161 remaining between the upper bump 140 and the lower bump 150 may be minimized.

Figure 16:
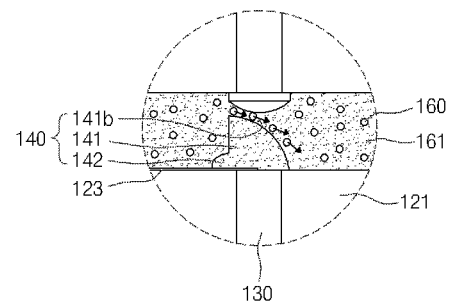
FIG. 16 is an enlarged view for an embodiment of the part "B" of FIG. 14.

FIG. 16 is an enlarged view of an embodiment of the part "B" of FIG. 14.

As shown in FIG. 16, upper bumps 140 of an embodiment are distinguished with the previous embodiments of FIG. 15 in that step members 142 may be formed of the same substance as conductive members.

That is to say, the step member 142 may be formed on a first surface 121a (see FIG. 14) of the semiconductor substrate 121 to a predetermined height and is placed to expose a portion of the through via 130. Due to the presence of the step member 142 which may be formed on the first surface 121a (see FIG. 14) of the semiconductor substrate 121 in such a way as to define a step, a conductive member 141 formed thereon may naturally have an inclined surface 141b. The step member 142 may be formed of the same substance as the conductive member 141, for example, copper. In the case where the step member 142 is formed of the conductive substance, an insulation member 123 is interposed between the first surface 121a of the semiconductor substrate 121 and the step member 142.

The conductive member 141 may be formed on the step member 142 and the through via 130 through a plating process using the through via 130 as a seed. The conductive member 141 may be formed on the step member 142 and the through via 130 to be electrically connected with the portion of the through via 130 which is exposed out of the step member 142. In this way, since the conductive member 141 is plated in the state in which a step is formed by the step member 142, the conductive member 141 may be naturally formed to have not a horizontal surface but an inclined surface 141b.

The above-described semiconductor package technology may be applied to various kinds of semiconductor devices and package modules having the same.

Figure 17:
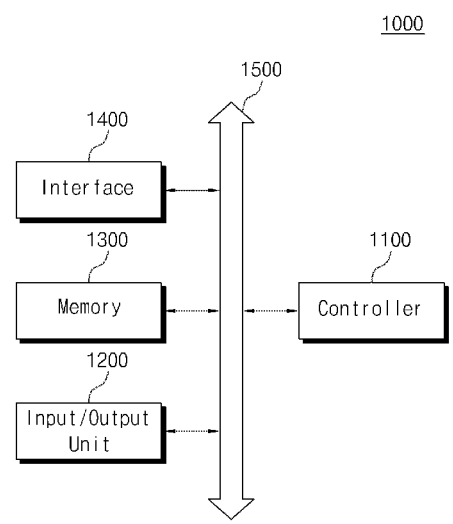
FIG. 17 is a system block diagram of an electronic apparatus to which the semiconductor package according to an embodiment is applied.

Referring to FIG. 17, the semiconductor package in accordance with an embodiment may be applied to an electronic system 1000. An electronic system 1000 may include a controller 1100, an input/output unit 1200, and a memory 1300. The controller 1100, the input/output unit 1200 and the memory 1300 may be coupled with one another through a bus 1500 providing a path through which data move. For example, the controller 1100 may include at least any one of at least one microprocessor, at least one digital signal processor, at least one microcontroller, and logic devices capable of performing the same functions as these components. The controller 1100 and the memory 1300 may include at least any one of the semiconductor packages according to the various embodiments. The input/output unit 1200 may include at least one selected among a keypad, a keyboard, a display device, and so forth. The memory 1300 is a device for storing data. The is memory 1300 may store data and/or commands to be executed by the controller 1100, and the likes.

The memory 1300 may include a volatile memory device such as a DRAM and/or a nonvolatile memory device such as a flash memory. For example, a flash memory may be mounted to an information processing system such as a mobile terminal or a desk top computer. The flash memory may be constituted by a semiconductor disc device (SSD). In this case, the electronic system 1000 may stably store a large amount of data in a flash memory system.

The electronic system 1000 may further include an interface 1400 configured to transmit and receive data to and from a communication network. The interface 1400 may be a wired or wireless type. For example, the interface 1400 may include an antenna or a wired or wireless transceiver. Further, the electronic system 1000 may be additionally provided with an application chipset, a camera image processor (CIS), an input/output unit, etc.

The electronic system 1000 may be realized as a mobile system, a personal computer, an industrial computer or a logic system performing various functions. For example, the mobile system may be any one of a personal digital assistant (PDA), a portable computer, a web tablet, a mobile phone, a smart phone, a wireless phone, a laptop computer, a memory card, a digital music system and an information transmission/reception system.

In the case where the electronic system 1000 is an equipment capable of performing wireless communication, the electronic system 1000 may be used in a communication system such as of CDMA (code division multiple access), GSM (global system for mobile communication), NADC (north American digital cellular), E-TDMA (enhanced-time division multiple access), WCDAM (wideband code division multiple access), CDMA2000, LTE (long term evolution) and Wibro (wireless broadband Internet).

Figure 18:
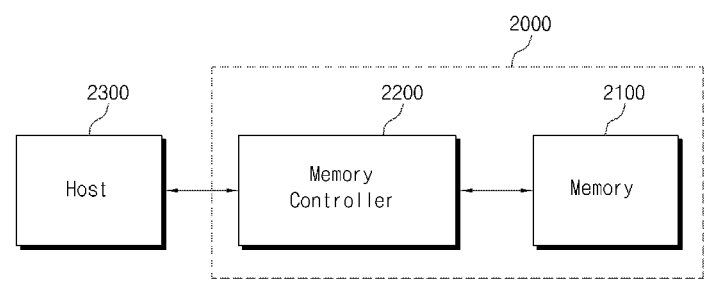
FIG. 18 is a block diagram showing an example of an electronic apparatus which includes the semiconductor package according to an embodiment.

Referring to FIG. 18, the semiconductor package in accordance with the embodiments of the present invention may be provided in the form of a memory card 2000. For example, the memory card 2000 may include a memory 2100 such as a nonvolatile memory device and a memory controller 2200. The memory 2100 and the memory controller 2200 may store data or read stored data.

The memory 2100 may include at least any one among nonvolatile memory devices to which the semiconductor package technology of the various embodiments is applied. The memory controller 2200 may control the memory 2100 such that stored data is read out or data is stored in response to a read/write request from a host 2300.

Although various embodiments have been described for illustrative purposes, those skilled in the art will appreciate that various modifications, additions and substitutions are possible, without departing from the scope and the spirit of the invention as disclosed in the accompanying claims.

What is claimed is:

1. A semiconductor chip comprising:
   a semiconductor substrate having a first surface and a second surface which faces away from the first surface;
   a through via formed to pass through the first surface and the second surface of the semiconductor substrate; and
   an upper bump having a step member formed on a portion of the through via and having the shape of a hemisphere, and a conductive member formed directly on the through via and the step member to have an inclined surface, wherein the conductive member substantially functions as a substantial bump.

2. The semiconductor chip according to claim 1, wherein the step member is formed on the through via and a portion of the first surface of the semiconductor substrate.

3. The semiconductor chip according to claim 1, wherein the step member is formed of an insulation substance or the same conductive substance as the through via.

4. The semiconductor chip according to claim 3, further comprising:
   an insulation member interposed between the step member formed of the conductive substance and the first surface of the semiconductor substrate.

5. The semiconductor chip according to claim 1, wherein the inclined surface of the conductive member is formed in a direction facing away from a position where the step member is formed.

6. The semiconductor chip according to claim 1, wherein the inclined surface of the conductive member comprises a curved surface or a substantially linear inclined surface.

7. The semiconductor chip according to claim 1, further comprising:
   a lower bump formed on the second surface of the semiconductor substrate and electrically connected with the through via.

* * * * *